United States Patent [19]

Zeininger et al.

[11] Patent Number: 5,780,929
[45] Date of Patent: Jul. 14, 1998

[54] FORMATION OF SILICIDED JUNCTIONS IN DEEP SUBMICRON MOSFETS BY DEFECT ENHANCED COSI2 FORMATION

[75] Inventors: Heinrich Zeininger, Obermichelbach; Christoph Zeller, Ottobrunn; Udo Schwalke, Heldenstein; Uwe Doebler, Berlin, all of Germany; Wilfried Haensch, Charlotte, Vt.

[73] Assignee: Siemens Aktiengesellschaft, Munich, Germany

[21] Appl. No.: 744,132

[22] Filed: Nov. 5, 1996

Related U.S. Application Data

[63] Continuation of Ser. No. 615,370, Mar. 14, 1996, abandoned, which is a continuation of Ser. No. 503,297, Jul. 17, 1995, abandoned, which is a continuation of Ser. No. 252,014, Jun. 19, 1994, abandoned, which is a division of Ser. No. 26,944, Mar. 5, 1993, Pat. No. 5,344,793.

[51] Int. Cl.$^6$ .......................... H01L 23/532; H01L 29/43
[52] U.S. Cl. .......................... 257/751; 257/757; 257/768; 257/383; 257/384
[58] Field of Search .......................... 257/382–384, 257/754, 757, 768, 769, 741

[56] References Cited

U.S. PATENT DOCUMENTS

| | | | |
|---|---|---|---|
| 3,661,747 | 5/1972 | Byrnes, Jr. et al. | 204/192 |
| 5,047,367 | 9/1991 | Wei et al. | 437/200 |
| 5,162,259 | 11/1992 | Kolar et al. | 437/192 |

FOREIGN PATENT DOCUMENTS

| | | |
|---|---|---|
| 0 325 328 | 7/1989 | European Pat. Off. . |

OTHER PUBLICATIONS

Ditusa et al., Quantum Transport in Ultrathin CoSi$_2$ Epitaxial Films, Appl. Phys. Lett., vol. 57, No. 5, 30 Jul. 1990, pp. 452–454.

Lasky et al., Comparison of Transformation to Low–Resistivity Phase and Agglomeration of TiSi$_2$ and CoSi$_2$, IEEE Trans on Electron Devices, vol. 38, No. 2, Feb. 1999, pp. 262–269.

"Shallow Junction Formation By The Redistribution Of Species Implanted Into Cobalt Silicide", Ditchek et al., MRS Proceedings, vol. 92, pp. 199–201.

J.Y. Veuillen et al., "CO/SI(111) Interface Formation of an Initial COSI2 Phase at Room Temperature", Applied Physics Letters, vol. 51, No. 18, 2 Nov. 1987, New York, pp. 1448–1450.

"Application of Self–Aligned COSI2 Interconnection in Submicrometer CMOS Transistors", E.K. Broadbent et al. IEEE Transactions on Electron Devices vol. 36, No. 11, Nov. 1989, New York pp. 2440–2446.

*Primary Examiner*—Peter Toby Brown
*Attorney, Agent, or Firm*—Adel A. Ahmed

[57] ABSTRACT

Deep submicran mosfets with defect enhanced CoSi2 formation and improved silicided junctions. A silicon wafer having a diffusion window is first precleaned with hydrofluoric acid. After the HF precleaning, the silicon wafer is transferred to a conventional cobalt sputtering tool where it is sputter cleaned by bombardment with low energy Ar+ions so as to form an ultra-shallow damage region. After the sputter cleaning, and without removing the wafer from the sputtering tool, Cobalt metal is deposited on the silicon wafer at room temperature and a CoSi2 layer is formed in the diffusion window.

20 Claims, 2 Drawing Sheets

FORMATION OF SILICIDED JUNCTIONS IN DEEP SUBMICRON MOSFETS BY DEFECT ENHANCED COSI2 FORMATION

This is a continuation of Ser. No.08/615,370 filed Mar. 14, 1996 and now abandoned, which is a continuation of Ser. No. 08/503,297, filed Jul. 17, 1995 and now abandoned; which is a continuation of Ser. No. 08/252,014, filed Jun. 1,1994 and now abandoned, which is a division of Ser. No. 08/026,944, filed Mar. 5, 1993 and now U.S. Pat. No. 5,344,793.

BACKGROUND OF THE INVENTION

1. Field of the Invention

This invention relates to an improved method of forming semiconductor integrated circuit devices and more particularly to an improved method of forming silicided junctions as part of such devices.

2. Related Art

Silicides provide low sheet and contact resistance in deep sub-micron MOSFETs (MOSFETS having junction depths smaller than 1500 Angstroms). Self-aligned silicide processes are useful in deep sub-micron MOSFETS. The drive-in of dopants from silicides also lowers the generation of defect induced junction leakage current.

The silicide formation at the silicon surface is determined by the properties of the metal silicon interface. The deposition of highly pure metal and a clean surface are required for silicide reaction. Any residues or contaminants lead to non-uniform and rough silicide layers.

The process of integration requires the formation of a stable silicide phase. Metastable silicide layers may interfere with adjacent layers and influence the performance of the devices. The mechanism of the silicide formation and the thermal budget of the integrated process determine the grain size of the cobalt silicides. A high surface energy of cobalt silicide grains leads to an agglomeration of large silicide grains during the annealing process. The grains may even penetrate the diffusion layer. Eventually, an epitaxial regrowth of silicon between the silicide grains degrades the silicide layers. Leakage currents of such silicided junctions are increased by some orders of magnitude.

Conventionally, the cleaning of the silicon surface is performed with hydrofluoric acid (HF) prior to the metal deposition. The thermodynamically stable CoSi2 phase is formed at an annealing temperature of 750 degrees Celsius (30 seconds, rapid thermal annealing RTA) via the Co2Si and CoSi phases. This results in a rough silicide/silicon interface. Further processing, such as ion implantation into the silicide, can lead to damage of the silicon crystal if the silicide film is pulled off the corner of the diffusion windows. The large grains agglomerate at higher annealing temperatures, i.e. during the drive in of the dopants.

Neither an HF dip, an HF bath or HF spraying procedure guarantee a uniformly clean silicon surface in diffusion windows (adhesion, surface energy). Cleaning the corners of diffusion windows efficiently is especially problematic. The disadvantages are rough silicide/silicon interfaces and highly stressed silicide layers which will often lead to heavy agglomeration, layer degradation and leaky junctions.

Summary of the Invention

The present invention provides defect enhanced CoSi2 formation and improved silicided junctions in deep submicron MOSFETs. According to one aspect of the present invention, a silicon wafer is first precleaned with hydrofluoric acid. After the HF precleaning, the silicon wafer is transferred to a conventional cobalt sputtering tool where it is sputter cleaned by bombardment with low energy ions. The low energy bombardment forms an ultrashallow damage region in the bulk silicon. After the sputter cleaning, cobalt metal is deposited on the silicon wafer at room temperature so as to form the CoSi2 layer.

Brief Description of the Drawing

The present invention will be better understood by reference to the drawing, in which.

Like reference numerals appearing in more than one Figure depict like elements.

Detailed Description of the preferred Embodiment

Figure 1:
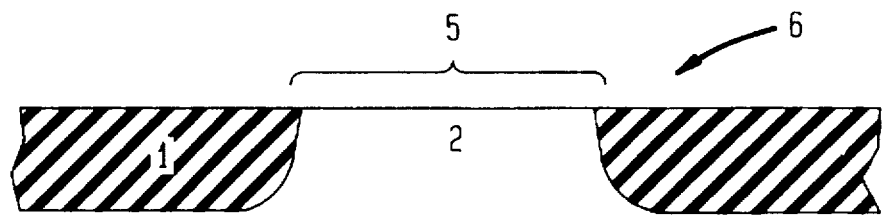
FIG. 1 shows an uncleaned silicon wafer having a diffusion window open in the oxide isolation so as to expose the bulk silicon.

First, silicon wafers which have been precleaned in an HF dip (in a conventional manner) are transferred to a conventional cobalt sputtering tool. FIG. 1 shows an uncleaned silicon wafer 6 having a diffusion window 5 open in the oxide isolation 1 so as to expose the bulk silicon 2. Formation of the diffusion window is accomplished in a conventional manner and is not the subject of this invention.

According to an embodiment of the present invention, silicon wafers of the type shown in FIG. 1 are first precleaned in an HF dip and then transferred to a conventional cobalt sputtering tool. Next, the tool is evacuated and the wafers'silicon surfaces are sputter cleaned, in the cobalt sputtering tool, with low energy Ar+ions. For example, in an Applied Materials AME 5500 cobalt sputtering tool, the appropriate parameters for the sputter cleaning are 1.5 keV at 1 uA for 10 minutes. It should be understood, that the present method contemplates that the time and energy values could vary from those in the example depending upon the characteristics of the sputtering tool. A typical range for the time and energy values is 0.5–1.5 keV at 1–2 uA for 10–15 minutes. In any event, the selected energy level must avoid radiation damage in the bulk substrate while damaging only the uppermost layers (in the range of three to twenty monolayers) of the silicon exposed by the diffusion window.

Figure 2:
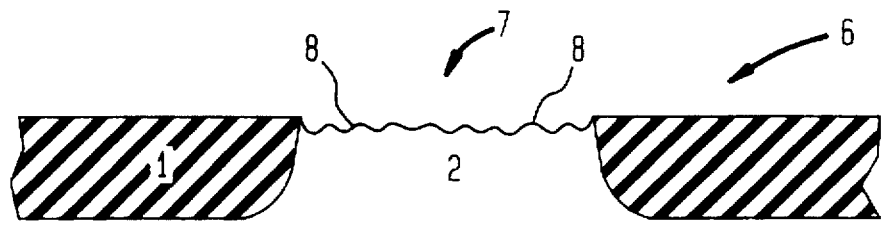
FIG. 2 shows the silicon wafer of FIG. 1 after HF dip and sputter cleaning according to an embodiment of the present invention.

FIG. 2 shows the silicon wafer of FIG. 1 after the HF dip and sputter cleaning. During the HF dip, a portion of the oxide isolation 1 is removed from each wafer 6. The low energy Ar+ion bombardment during sputter cleaning causes the several monolayers of the exposed surface of the bulk silicon 2 to be damaged. This sputter induced, ultra shallow damage region 7 provides a significantly larger number of nucleation sites 8 for silicide formation than would otherwise be achieved with a smooth HF cleaned only sample. An advantage of the low energy used during sputtering is that the depth of the damage region can be better controlled and limited to a small number of monolayers (typically about 20). This also causes the nucleation sites to be more evenly disbursed within the damage region. Also, advantageously, the sputter induced damage is not dependant on the topography of the product wafers. The silicon surface at mask edges or in diffusion windows is equally exposed to the Ar+ions.

Figure 3:
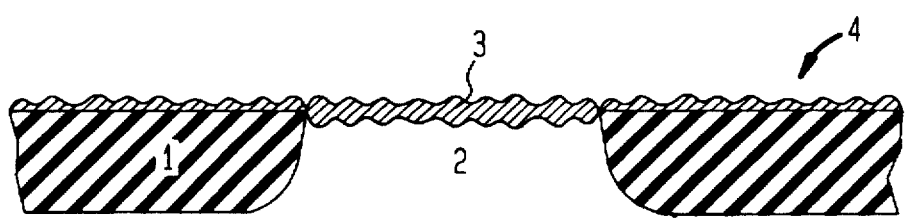
FIG. 3 shows the silicon wafer of FIG. 2 after cobalt deposition according to an embodiment of the present invention.

Next, at room temperature (about 25 degrees Celsius), cobalt metal 4 is deposited on the wafers using the same cobalt sputtering tool in which the wafers were sputter cleaned. FIG. 3 shows the silicon wafer of FIG. 2 after the cobalt deposition. Advantageously, the wafers are not removed from the cobalt sputtering tool. Thus, there is no exposure to air and no contamination chalks the cleaning and the deposition steps. The advantage of the presputtering (described above) is the defect induced formation of the thermodynamically stable CoSi2 phase in an exothermal reaction. Thus, the CoSi2 layer 3 is formed during the metal deposition at room temperatures. CoSi2 layers of less than 30 nanometers are formed without any annealing step. Thicker CoSi2 layers are formed without phase transitions at low temperatures, because of the high diffusivity of cobalt and the isotropic CoSi2 phase.

It should be understood that an annealing step of about 700–800 degrees Celsius can be added after the sputter process which will cause the damage to become shallower. Even with such an annealing step, the number of damaged sites will typically be sufficient for a stable CoSi2 layer.

Figure 4:
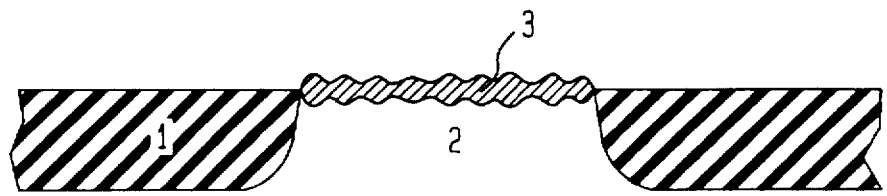
FIG. 4 shows the silicon wafer of FIG. 3 after conventional selective wet etching of the unreacted cobalt; and, FIG. 5 is a flow chart of a method of forming silicided junctions in a deep sub-micron MOSFET according to an embodiment of the present invention.

After the cobalt deposition, the wafers are wet etched in a conventional manner so as to remove the deposited unreacted cobalt. FIG. 4 shows the silicon wafer of FIG. 3 after the conventional selective wet etching.

Figure 5:
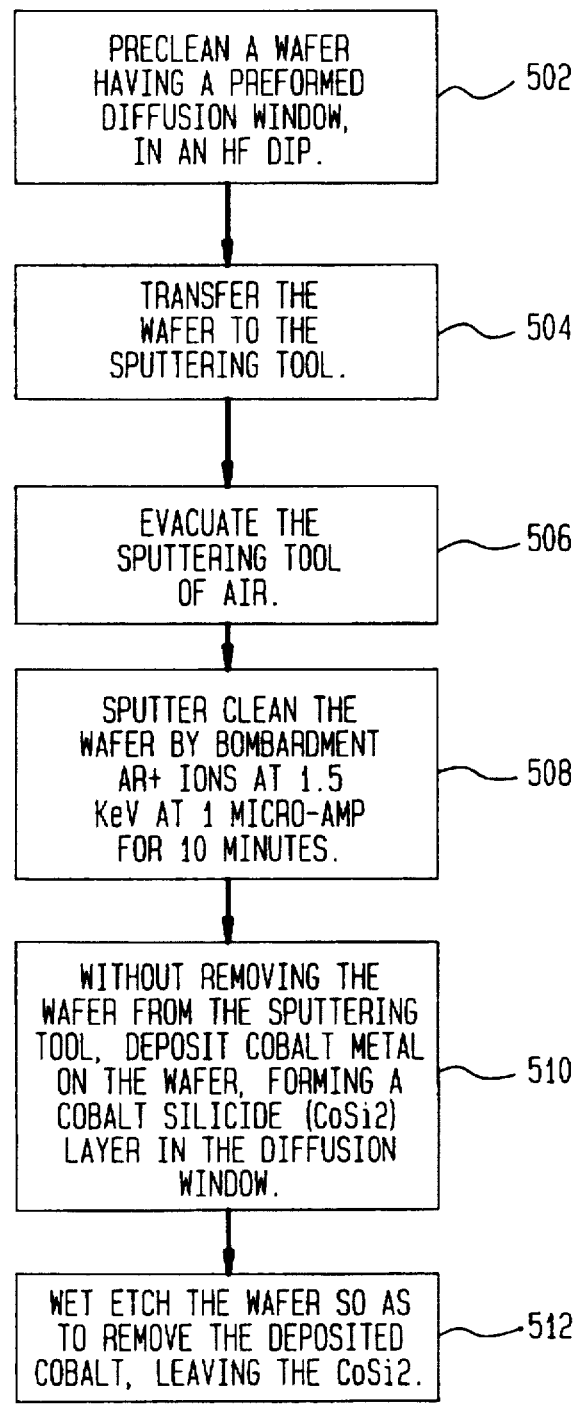

FIG. 5 (steps 502–512) is a flow chart summary of the above-described method of forming silicided junctions in a deep sub-micron MOSFET.

An advantage of the present invention is that the thermal stability of the CoSi2 layers is improved. Ion implantation into the silicide will not generate any crystal damage in the silicon. Further, the silicide layers, do not degrade during the outdiffusion of dopants.

Other advantages of the present invention include the provision of a highly reproducible process, uniform silicide layers (little or no agglomeration) and controlled CoSi2 formation. The present invention also, provides improved thermal stability of the CoSi2 junctions and improved junction leakage. After the sputter preclean, the silicide/silicon interface is smooth. Therefore, the junction depth is better defined and leaking pipes of CoSi2 through ultra-shallow junctions are prevented.

Many modifications of the above-described preferred embodiments will now occur to those skilled in the art. Thus it should be understood that the preferred embodiments are described by way of example and not by way of limitation. The scope of the invention is defined by the appended claims.

I claim:

1. A MOSFET semiconductor device, comprising:
   a silicon substrate having a surface with a plurality of monolayers of silicon intentionally damaged by low energy in bombardment;
   a defect enhanced cobalt silicide layer having no overlying barrier layer associated with said damaged silicon surface; and
   at least one silicided junction less than 1500 Angstroms in depth.

2. The device according to claim 1 wherein said cobalt silicide layer comprises $CoSi_2$ with a thickness of less than 30 nanometers.

3. The device according to claim 1 further including an oxide isolation region adjacent to said damaged silicon surface.

4. The device according to claim 1 wherein said surface of said silicon substrate has three to seven monolayers of silicon intentionally damaged by low energy ion bombardment.

5. The device according to claim 1 wherein said surface of said silicon substrate is damaged by bombardment with low energy Ar+ ions; and wherein said cobalt silicide layer is formed from said damaged silicon substrate surface at room temperature without an annealing step.

6. The device according to claim 5 wherein said bombardment with low energy Ar+ ions is performed at about 1.5 kev at 1 μA.

7. The device according to claim 1 wherein said device comprises a sub-micron MOSFET.

8. The device as recited in claim 1 wherein said plurality of monolayers of silicon intentionally damaged is no greater than twenty monolayers of silicon.

9. The device as recited in claim 1 wherein said plurality of monolayers of silicon intentionally damaged is from three to seven monolayers of silicon.

10. A MOSFET semiconductor device, comprising:
    a defect enhanced cobalt silicide layer having no overlying barrier layer and having a thickness of less than 30 nanometers on a silicon substrate, said silicon substrate initially having a plurality of monolayers of silicon intentionally damaged by low energy ion bombardment, wherein said bombardment causes nucleation sites to be substantially evenly dispersed within said damage region, said monolayers having reacted with cobalt metal deposited thereon to produce said cobalt silicide layer.

11. The device according to claim 10 wherein said cobalt silicide layer comprises $CoSi_2$.

12. The device according to claim 10 having junctions of less than 1500 Angstroms and no agglomeration of silicides, and wherein said cobalt silicide layer on said silicon substrate forms a contact with sheet resistance of less than five ohms per Square.

13. The device according to claim 10 wherein said low energy ion bombardment comprises bombardment with low energy Ar+ ions at 1.5 kev at 1 μA.

14. The device according to claim 10 wherein said cobalt silicide layer is formed at room temperature with no further annealing step.

15. The device according to claim 10 wherein said device comprises a sub-micron MOSFET.

16. The device as recited in claim 10 wherein said plurality of monolayers of silicon intentionally damaged is no greater than twenty monolayers of silicon.

17. The device as recited in claim 10 wherein said plurality of monolayers of silicon intentionally damaged is from three to seven monolayers of silicon.

18. The device recited in claim 10 further comprising at least one silicided junction less than 1500 Angstroms in depth.

19. An improved submicron MOSFET semiconductor device comprising:
    a semiconductor body having a surface with a plurality of monolayers of silicon intentionally damaged by low energy ion bombardment, wherein said plurality of monlayers of silicon intentionally damaged is at least three monolayers of silicon and no greater than twenty monlayers of silicon; and
    a defect enhanced cobalt silicide layer less than 30 nanometers in depth associated with said damaged silicon surface, wherein said cobalt silicide layer has no overlying barrier layer.

20. The device as recited in claim 19 further comprising at least one silicided junction less than 1500 Angstroms in depth.

* * * * *